United States Patent
Huang et al.

(10) Patent No.: US 6,729,385 B1
(45) Date of Patent: May 4, 2004

(54) FIN STRUCTURE AND THE ASSEMBLY THEREOF

(75) Inventors: Wen-shi Huang, Taoyuan (TW); Kuo-cheng Lin, Taoyuan (TW); Yu-hung Huang, Ilan (TW); Wei-fang Wu, Taichung (TW)

(73) Assignee: Delta Electronics, Inc., Taiwan (TW)

( * ) Notice: Subject to any disclaimer, the term of this patent is extended or adjusted under 35 U.S.C. 154(b) by 0 days.

(21) Appl. No.: 10/462,305

(22) Filed: Jun. 13, 2003

(30) Foreign Application Priority Data

Jan. 21, 2003 (TW) .......................................... 92201119

(51) Int. Cl.[7] .................................................. F28F 7/00
(52) U.S. Cl. ...................... 165/80.3; 165/185; 361/697; 361/704; 174/16.3; 257/722
(58) Field of Search .............................. 165/80.3, 185; 361/697, 704; 257/706, 722; 174/16.3

(56) References Cited

U.S. PATENT DOCUMENTS

| 5,419,041 | A | * | 5/1995 | Ozeki | 29/890.03 |
|---|---|---|---|---|---|
| 6,199,627 | B1 | * | 3/2001 | Wang | 165/185 |
| 6,370,774 | B1 | * | 4/2002 | Sheu | 29/890.039 |
| 6,449,160 | B1 | * | 9/2002 | Tsai | 361/709 |
| 6,474,407 | B1 | * | 11/2002 | Chang et al. | 165/80.3 |
| 6,607,023 | B2 | * | 8/2003 | Ho et al. | 165/78 |
| 6,607,028 | B1 | * | 8/2003 | Wang et al. | 165/185 |
| 6,619,381 | B1 | * | 9/2003 | Lee | 165/78 |
| 6,639,802 | B1 | * | 10/2003 | Dong et al. | 361/704 |
| 6,644,386 | B1 | * | 11/2003 | Hsu | 165/80.3 |
| 6,644,397 | B1 | * | 11/2003 | Shen | 165/185 |
| 6,651,733 | B1 | * | 11/2003 | Horng et al. | 165/80.3 |
| 6,655,448 | B1 | * | 12/2003 | Lin | 165/80.3 |

* cited by examiner

*Primary Examiner*—Terrell McKinnon
(74) *Attorney, Agent, or Firm*—Martine & Penilla, LLP

(57) ABSTRACT

A fin structure is disclosed. The fin structure includes a first concavo-convex portion formed with a concave on a first surface of the fin in the direction of thickness and a corresponding convex on a second surface of the fin in the direction of thickness. Besides, a second concavo-convex portion formed with a first concave and second concave on the first surface of the fin in the direction of thickness and a corresponding first convex and a corresponding second convex on the second surface of the fin in the direction of thickness is included as well. Specifically, the first and second concavo-convex portions are symmetrical respect to the center of the fin. Furthermore, the second convex of the second concavo-convex portion on one fin can be exactly received by the concave of the first concavo-convex portion on another fin.

13 Claims, 5 Drawing Sheets

FIN STRUCTURE AND THE ASSEMBLY THEREOF

FIELD OF THE INVENTION

This invention relates to a fin structure and, more particularly, to a heat-dissipating fin structure to be assembled for heat dissipation and the assembly thereof.

DESCRIPTION OF THE PRIOR ART

When using electronic products, the heat produced therefrom is usually removed by a heat sink, and the operating efficiency of the electronic products is thereby increased and prevented from damaging. For example, the central processing unit (CPU) of a computer system may be provided with a high-density heat-dissipating fin assembly on it.

Usually, the heat from a heat source is transferred to a heat sink and then taken away by heat convection. In this case, a heat sink must have a large area for improving the heat convection effect and further raising the heat dissipating efficiency. Accordingly, it is preferable to maximize the number of the fins on a substrate for the high-density heat-dissipating fin assembly.

Up to now, however, the fabricating techniques for fins and the limitations on fastening and assembling fins have prevented the space between two adjacent fins from being further reduced. Therefore, it is difficult to achieve a maximum fin number.

For example, the published Taiwan patent No. 365411 has disclosed a heat-dissipating fin assembly composed of a front fin, a rear fin, and a plurality of middle fins. In this case, since the space between any two adjacent fins is determined by the thickness of an extra concave portion on the fin, the space cannot be reduced as desired.

Still an example, the published Taiwan Patent No. 506247 has disclosed a heat sink composed of a plurality of high-density heat-dissipating fins. In this case, since the plurality of fins are assembled by employing hooks and grooves provided thereon, the space between any two adjacent fins still can not be effectively reduced due to the hook length required to assemble the fins.

According to the above-mentioned drawbacks of the conventional fin assemblies, the invention provides a fin structure being capable of minimizing the space between two adjacent fins in an assembly. Thus, the number of the fins on a substrate can be effectively increased and the heat-dissipating efficiency of a heat sink can be improved.

SUMMARY OF THE INVENTION

To solve the above-mentioned problems, one object of the invention is to provide a fin structure to minimize the space of two adjacent fins in an assembly.

Another object of the invention is to provide a fin structure to maximize the number of the fins of a fin assembly.

In one aspect of the invention, the invented fin structure includes a first concavo-convex portion and a second concavo-convex portion. The first concavo-convex portion is formed with a concave on a first surface of the fin in the direction of thickness, and a corresponding convex on a second surface of the fin in the direction of thickness. The second concavo-convex portion is formed with a first concave and a second concave on the first surface of the fin in the direction of thickness, and a corresponding first convex and a corresponding second convex on the second surface of the fin in the direction of thickness. Wherein, the first concavo-convex portion and the second concavo-convex portion are symmetrical with respect to a center of the fin, and the second convex of the second concavo-convex portion can be exactly received by the concave of the first concavo-convex portion.

In another aspect of the invention, the fin structure of the invention further includes a plurality of protruding sheets provided on two sides of the fin. In addition, one fin is clasped and mounted with another fin by riveting the concave of the first concavo-convex portion on one fin and the second convex of the second concavo-convex portion on another fin and by bending the protruding sheets.

The invention discloses a fin assembly assembled by clasping a plurality of fins. Each of the fins has a characterization the same as the above described fin structure.

To be emphasized in this aspect is that the first convex of the second concavo-convex portion has a height equaling to a space between two adjacent fins. In addition, the protruding sheets are bent in a cross manner.

The invention has the following advantages. First, the formation of the concavo-convex portions are easy to control, therefore, a minimum space between two adjacent fins can be achieved. Secondly, it is convenient to clasp the concavo-convex portions and the protruding sheets, and the assembled assembly would not depart easily. Thirdly, the invention uses only one fin structure and therefore enables a more simplified and effective assembly. Fourthly, the fin structure designed in the invention is appropriate for formations of common aluminum and copper materials.

DETAILED DESCRIPTION OF THE PREFERRED EMBODIMENTS

A fin structure and a fin assembly in accordance with preferred embodiments of the invention will be described in detail with reference to the accompanying drawings.

Figure 1:
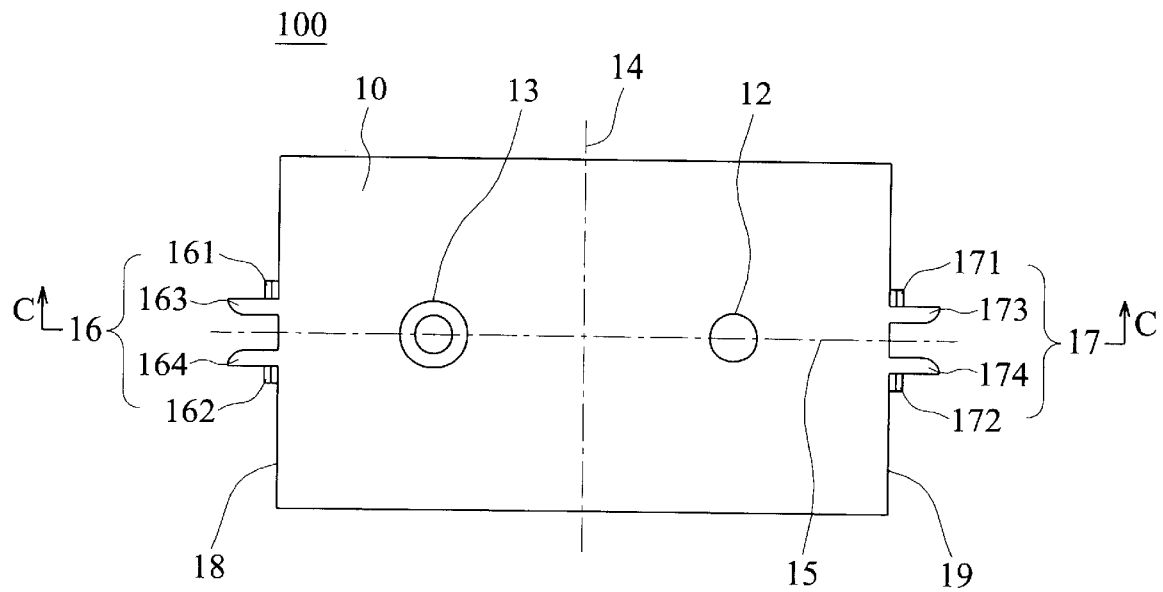
FIG. 1 is a front view showing a fin structure in accordance with a first embodiment of the invention.
Figure 2:
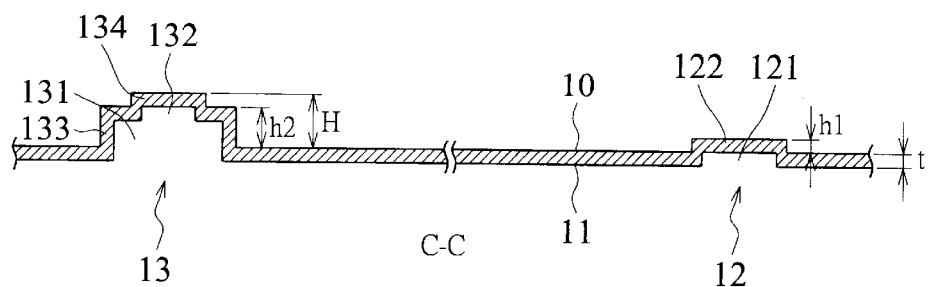
FIG. 2 is a cross-sectional view taken along a line C—C in FIG. 1, showing the concavo-convex portion of the fin structure in accordance with the first embodiment of the invention.

Referring to FIGS. 1 and 2, a fin 100 according to the first embodiment of the invention is provided with two concavo-convex portions 12 and 13 having a cylindrical shape. The concavo-convex portions 12 and 13 are formed on a transverse central line 15 of the fin 100, respectively, and arranged to be symmetrical with respect to a longitudinal central line 14 of the fin 100. Herein, the concavo-convex portion 12 is formed by stamping the lower surface 11 to depress toward the upper surface 10. Thus, the concavo-convex portion 12 forms a concave 121 on the lower surface 11 of the fin 100 and a corresponding convex 122 on the upper surface 10 of the fin 100.

Similarly, the concavo-convex portion 13 is formed by stamping the lower surface 11 to depress toward the upper surface 10 of the fin 100. Thus, a first concave 131 and a second concave 132 are formed on the lower surface 11 of the fin 100 and corresponding first convex 133 and second convex 134 are formed on the upper surface 10 of the fin 100.

Especially, these concavo-convex portions 12 and 13 are so designed that the second convex 134 of the first concavo-convex portion 13 on one fin is received by the concave 121 of the concavo-convex portion 12 on another fin. In other words, the second convex 134 of the first concavo-convex portion 13 on one fin and the concave 121 of the concavo-convex portion 12 on another fin are closely fit. Moreover, the height h2 between the upper surface of the first convex 133 of the concave-convex portion 13 and the upper surface 10 of the fin 100 is designed to equal a desired space between any two adjacent fins after being assembled. In addition, the height h2 is equal to or larger than the height h1 between the upper surface of the convex 122 of the concave-convex portion 12 and the upper surface 10 of the fin 100.

Figure 3:
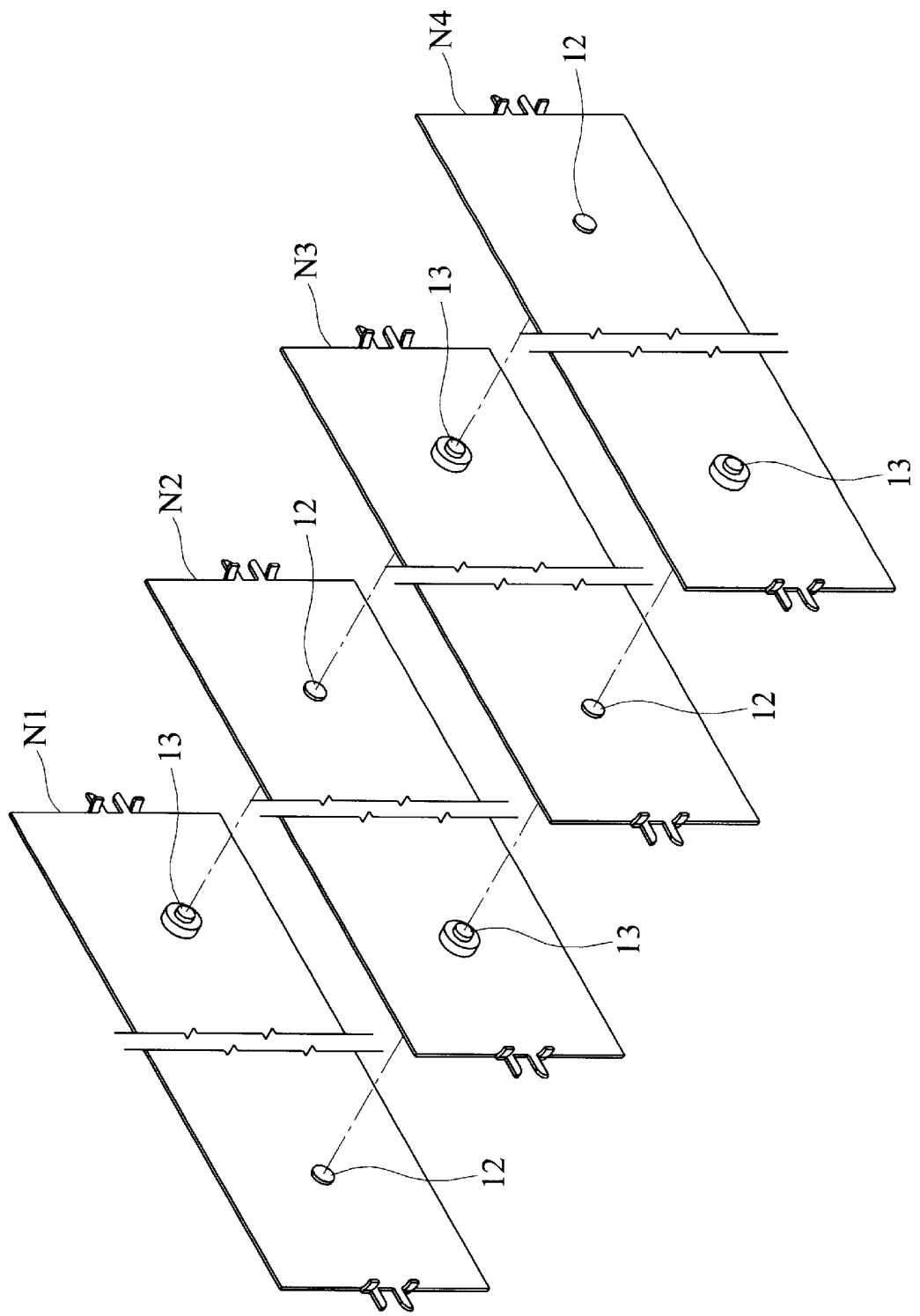
FIG. 3 is a simplified schematic diagram showing the alignment of a plurality of the fins having the structure in accordance with the first embodiment of the invention.

Consequently, as shown in FIG. 3, a plurality of the fins with such a structure can be assembled one by one that the convex 134 of the concavo-convex portion 13 on the odd fins N1, N3 . . . are riveted with the concave 121 of the concavo-convex portion 12 on the even fins N2, N4 . . . respectively. Meanwhile, since the height h1 and H of the concavo-convex portions 12 and 13 are determined by the thickness t of the fins (see FIG. 2), the space between two adjacent fins can be minimized in an assembly. Therefore, the object for maximizing the fin number on a substrate (not shown) can be achieved.

On the other hand, as shown in FIG. 1, the fin according to the first embodiment of the invention is further provided with protruding sheets 16 and 17 at the central part of the sides 18 and 19 of the fin 100. Among these protruding sheets 16 and 17, the short sheets 161, 162, 171 and 172 are bent to be substantially perpendicular to the fin before a plurality of the fins are assembled (see FIG. 3). Thereby, the plurality of fins can be effectively clasped in the assembly.

Figure 4:
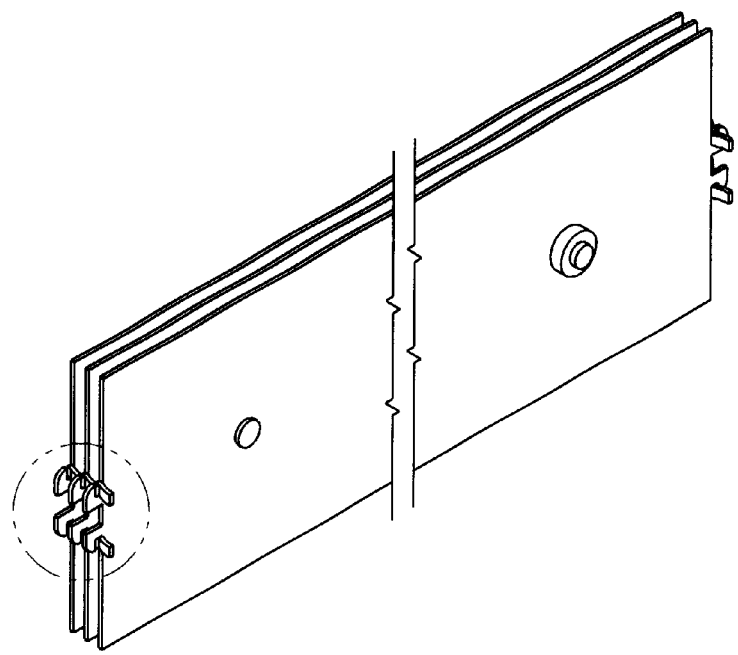
FIG. 4 is a simplified schematic diagram showing the assembly of the plurality of fins in accordance with the first embodiment of the invention.

Subsequently, after the plurality of fins are clasped (see FIG. 4), the long sheets 163, 164, 173 and 174 are bent to L-shapes for further fixing the clasped short protruding sheets 161, 162, 171 and 172 and completing the assembly.

Figure 5:
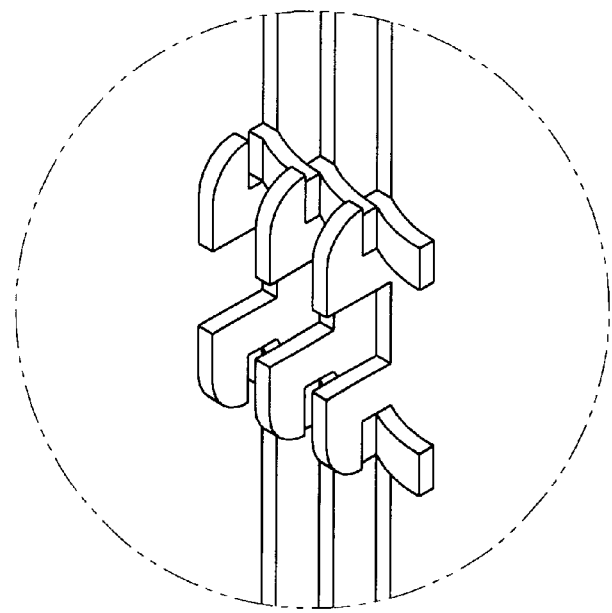
FIG. 5 is an enlarged diagram showing the protruding sheets provided on sides of the fins after a plurality of fins are assembled in accordance with the first embodiment of the invention.

As shown in FIG. 5, the protruding sheets are bent in a cross manner, that is, the directions of short protruding sheets 161, 162, 171 and 172 are perpendicular with the directions of long protruding sheets 163, 164, 173 and 174.

Figure 6:
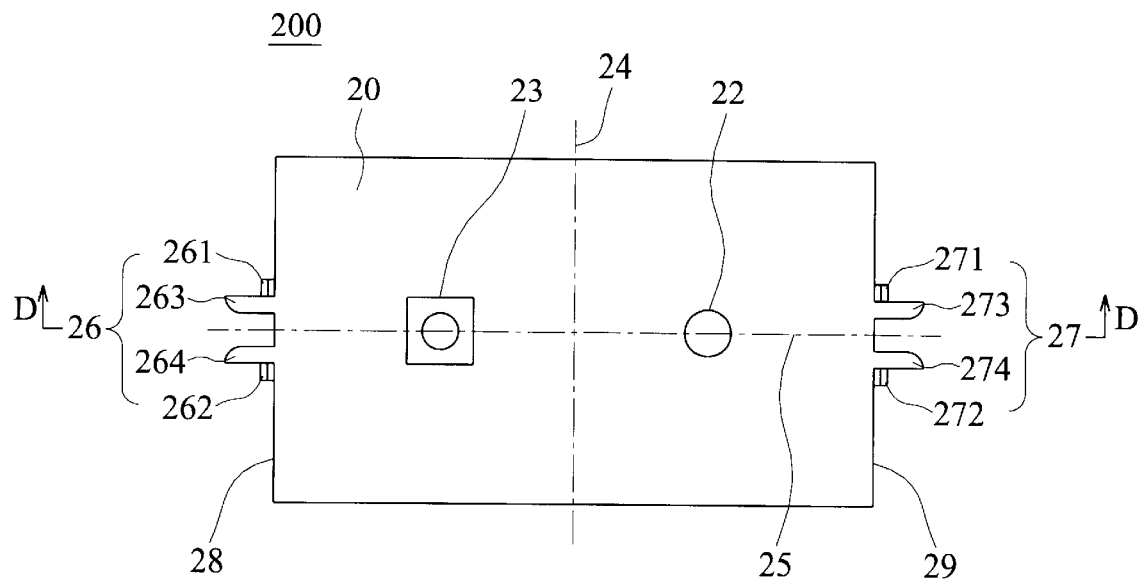
FIG. 6 is a front view showing a fin structure in accordance with a second embodiment of the invention.
Figure 7:
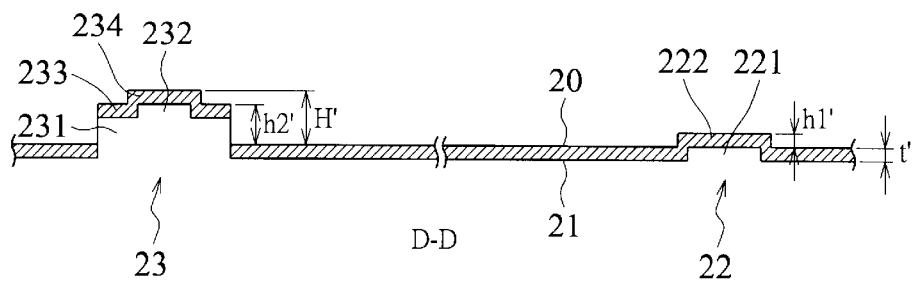
FIG. 7 is a cross-sectional view taken along a line D—D in FIG. 6, showing the concavo-convex portion of the fin structure in accordance with the second embodiment of the invention.

As shown in FIGS. 6 and 7, the fin 200 is provided with two concavo-convex portions 22 and 23. These concavo-convex portions 22 and 23 are formed on a transverse central line 25 of the fin 200, respectively, and arranged to be symmetrical with respect to a longitudinal central line 24 of the fin 200. Herein, the concavo-convex portion 22 is formed by stamping the lower surface 21 of the fin 200 to depress toward the upper surface 20 of the fin 200. Consequently, the concavo-convex portion 22 forms a concave 221 on the lower surface 21 of the fin 200 and forms a convex 222 on the upper surface 20 of the fin 200.

Similarly, the concavo-convex portion 23 is formed by stamping the lower surface 21 of the fin 200 to depress toward the upper surface 20 of the fin 200. Thus, a first concave 231 and a second concave 232 are formed on the lower surface 21 of the fin 200 while a corresponding first convex 233 and a corresponding second convex 234 are formed on the upper surface 20 of the fin 200.

Especially, these concavo-convex portions 22 and 23 are characterized by the following arrangement. First, the second convex 234 of the first concavo-convex portion 23 is designed to be received by the concave 221 of the concavo-convex portion 22. That is, the second convex 234 of the concavo-convex portion 23 and the concave 221 of the concavo-convex portion 22 can be closely fit with each other. Secondly, the height h2' between the upper surface of the first convex 233 of the concavo-convex portion 23 and the upper surface 20 of the fin 200 is designed to be a desired space between any two adjacent fins after being assembled. In addition, the height h2' is equal to or larger than the height h1' between the upper surface of the convex 222 of the concave-convex portion 22 and the upper surface 20 of the fin 200. Thirdly, the first concave 231 of the concavo-convex portion 23 has been transversely punched for airflow pass so that heat resistance can be reduced (see FIGS. 7 & 8). Fourthly, the concavo-convex portion 22 and the second convex 234 of the concavo-convex portion 23 are shaped to be cylindrical while the first convex 233 of the concavo-convex portion 23 is shaped to be prismatic (see FIGS. 7 & 8).

Figure 8:
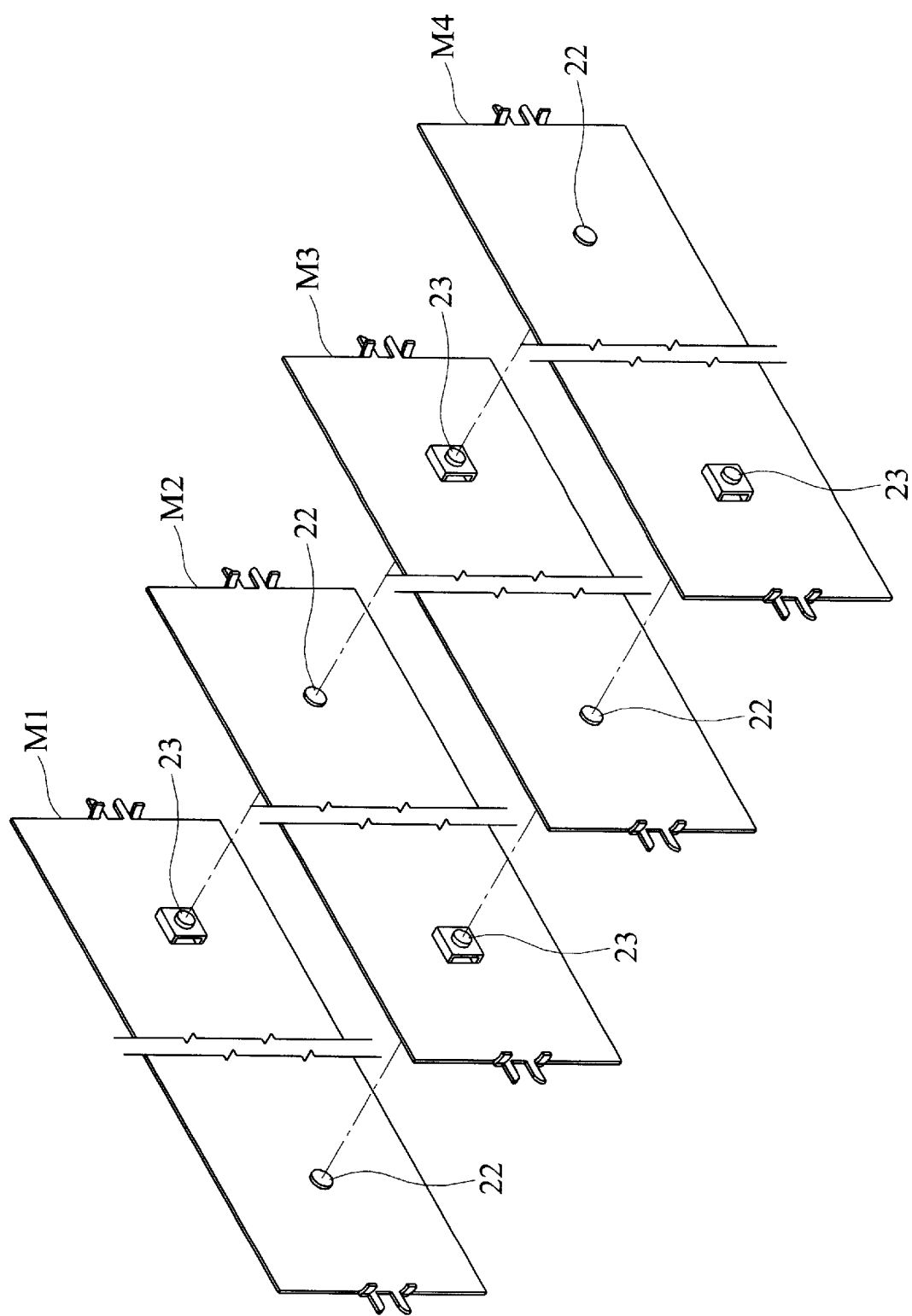
FIG. 8 is a simplified schematic diagram showing the alignment of a plurality of fins having the structure in accordance with the second embodiment of the invention in the assembly.

Consequently, as shown in FIG. 8, a plurality of fins can be assembled so that the convex 234 of the concavo-convex portion 23 on the odd fins M1, M3 . . . are riveted with the concave 221 of the concavo-convex portion 22 on the even fins M2, M4 . . . , respectively. Meanwhile, since the heights h1' and H' of the concavo-convex portions 22 and 23 are determined by the thickness t' (see FIG. 7) of the fins, the space between two adjacent fins can be minimized in the assembly. Therefore, one can design a preferred fin thickness t' so as to achieve the object of maximizing the fin number on a substrate (not shown).

On the other hand, as shown in FIG. 6, the fin 200 in accordance with the second embodiment of the invention is further provided with protruding sheets 26 and 27 at the central part of the sides 28 and 29 of the fin 200. Among these protruding sheets 26 and 27, the short protruding sheets 261, 262, 271 and 272 are pre-bent to be substantially perpendicular to the fin (see FIG. 3) before a plurality of fins are assembled. Thereby, a plurality of fins can be effectively clasped in the assembly.

Subsequently, after the plurality of fins are clasped (not shown), the long protruding sheets 263, 264, 273 and 274 are bent to L-shapes (see FIG. 5), as the case in the first embodiment, for further fixing the clasped short protruding sheets 261, 262, 271 and 272. Herein, the protruding sheets are bent in a cross manner, as shown in FIG. 5.

Summing up the above, a plurality of fins are assembled by at least two concavo-convex portions arranged to be symmetrical with respect to the center of each fin and a plurality of protruding sheets provided on sides of each fin. In this way, not only the plurality of fins can be clasped firmly but also the space between any two adjacent fins can be minimized. Therefore, the fin number on a heat dissipating substrate can be maximized. Furthermore, comparing with the conventional case of using three kinds of fin structures to accomplish the assembly, the invention uses only one fin structure and therefore enables a more convenient way to assemble the fins. In addition, although methods for fabricating fins vary with the materials used, the fin structure of the invention does not have any problems in formation with regard to common aluminum- and copper-based materials.

It should be noted that the number of the concavo-convex portions on the fin of the invention is not limited to two. However, it is preferred that the concavo-convex portions are in an even number and are arranged to be symmetrical with respect to the center of the fins. Similarly, the number of the protruding sheets of the fin structure in accordance with the invention is not limited by the embodiments described above, however, an even number would be preferred.

The invention has been clearly described by each embodiment and the accompanying figures, however, it is apparent for those skilled in the art that each embodiment of the invention is not limited but exemplary. That is, various changes or modifications can be made without departing from the spirit and scope of the invention as defined by the appended claims. For example, the first convex of the second concavo-convex portion in the first and second embodiments of the invention can be shaped to be cylindrical, prismatic or other shapes.

What is claimed is:

1. A fin structure comprising:
    a first concavo-convex portion formed with a concave on a first surface of the fin in the direction of thickness, and a corresponding convex on a second surface of the fin in the direction of thickness; and
    a second concavo-convex portion formed with a first concave and a second concave on the first surface of the fin in the direction of thickness, and a corresponding first convex and a corresponding second convex on the second surface of the fin in the direction of thickness;
    wherein the first concavo-convex portion and the second concavo-convex portion are symmetrical with respect to the center of the fin, and the second convex of the second concavo-convex portion can be exactly received by the concave of the first concavo-convex portion.

2. The fin structure as set forth in claim 1, further comprising a plurality of protruding sheets provided on two sides of the fin, wherein one fin is clasped and mounted with another fin by riveting the concave of the first concavo-convex portion on one fin and the second convex of the second concavo-convex portion on another fin and by bending the plurality of protruding sheets.

3. The fin structure as set forth in claim 1, wherein the concave of the first concavo-convex portion and the second convex of the second concavo-convex portion are formed to have the same shape.

4. The fin structure as set forth in claim 1, wherein the first convex of the second concavo-convex portion is formed to have a prismatic shape.

5. The fin structure as set forth in claim 1, wherein the first convex of the second concavo-convex portion has been punched.

6. The fin structure as set forth in claim 1, wherein the first concavo-convex portion and the second concavo-convex portion are formed by a stamping process.

7. A fin assembly of a plurality of fins, each fin comprising:
    a first concavo-convex portion formed with a first concave and a second concave on a first surface in the direction of thickness, and a corresponding convex on a second surface in the direction of thickness; and
    a second concavo-convex portion formed with a first concave and a second concave on the first surface in the direction of thickness, and a corresponding first convex and a corresponding second convex on the second surface in the direction of thickness;
    wherein the first concavo-convex portion and the second concavo-convex portion of each fin are arranged to be symmetrical with respect to the center of each fin, and the concave of the first concavo-convex portion of one fin is riveted with the second convex of the second concavo-convex portion of an adjacent fin.

8. The fin assembly as set forth in claim 7, wherein each fin is further provided with a plurality of bendable protruding sheets on both sides for strengthening clasping of the fins.

9. The fin assembly as set forth in claim 7, wherein the concave of the first concavo-convex portion and the second convex of the second concavo-convex portion are formed to have a cylindrical shape.

10. The fin assembly as set forth in claim 7, wherein the first convex of the second concavo-convex portion is formed to have a prismatic shape.

11. The fin assembly as set forth in claim 7, wherein the first convex of the second concavo-convex portion has a height equaling to a space between two adjacent fins.

12. The fin assembly as set forth in claim 7, wherein the first convex of the second cancavo-convex portion of each fin has been punched.

13. The fin assembly as set forth in claim 8, wherein the protruding sheets are bent in a cross manner.

* * * * *